United States Patent
Prokopp

(10) Patent No.: US 6,340,893 B1
(45) Date of Patent: *Jan. 22, 2002

(54) PRINTED CIRCUIT BOARD TEST APPARATUS AND METHOD

(75) Inventor: Manfred Prokopp, Wertheim-Reicholzheim (DE)

(73) Assignee: atg test systems GmbH & Co. KG, Wertheim (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/667,476

(22) Filed: Sep. 22, 2000

Related U.S. Application Data

(63) Continuation of application No. 08/956,583, filed on Oct. 23, 1997, now abandoned.

(30) Foreign Application Priority Data

Oct. 28, 1996 (DE) .......................................... 196 44 725
May 2, 1997 (DE) .......................................... 197 18 637

(51) Int. Cl.⁷ .............................................. G01R 31/02
(52) U.S. Cl. ...................................... 324/754; 324/761
(58) Field of Search ............................... 324/754, 72.5, 324/761, 110, 73.1, 748, 158.1; 714/724, 725, 733, 734

(56) References Cited

U.S. PATENT DOCUMENTS

| | | | |
|---|---|---|---|
| 3,970,934 A | 7/1976 | Aksu | 324/754 |
| 4,724,383 A | 2/1988 | Hart | 324/754 |
| 4,935,696 A | 6/1990 | DiPerna | 324/761 |
| 4,977,370 A | 12/1990 | Andrews | 324/761 |
| 5,134,363 A | 7/1992 | Lang-Dahike | 324/761 |
| 5,157,325 A | 10/1992 | Murphy | 324/761 |
| 5,457,380 A | * 10/1995 | Blumenau | 324/158.1 |
| 5,491,427 A | 2/1996 | Ueno et al. | |
| 5,493,230 A | 2/1996 | Swart et al. | 324/754 |
| 5,633,598 A | 5/1997 | Van Loan et al. | 324/761 |
| 5,663,655 A | 9/1997 | Johnston et al. | 324/761 |
| 5,773,988 A | 6/1998 | Sayre et al. | 324/761 |
| 6,154,863 A | * 11/2000 | Prokopp | 714/724 |

FOREIGN PATENT DOCUMENTS

| | | | |
|---|---|---|---|
| DE | 38 38413 A1 | 5/1990 | G01R/31/28 |
| DE | 42 37 591 A1 | 5/1994 | G01R/31/28 |
| DE | 43 23 276 A1 | 1/1995 | G01R/31/28 |
| DE | 44 06 538 A1 | 8/1995 | G01R/31/28 |
| DE | 195 07 127 A1 | 9/1996 | G01R/31/28 |
| EP | 0 215 146 | 8/1988 | G01R/1/73 |
| EP | 0 448 483 A1 | 9/1991 | G01R/1/073 |
| EP | 0 636 895 A1 | 2/1995 | G01R/31/28 |
| FR | 2 608 775 | 6/1988 | G01R/31/02 |
| JP | 57-132392 | 8/1982 | H05K/3/00 |
| JP | 5-72231 | 3/1993 | G01R/1/073 |
| JP | 06-308184 | 11/1994 | G01R/31/02 |
| JP | 7-140202 | 6/1995 | G01R/31/28 |
| WO | WO 95/23341 | 8/1995 | G01R/31/00 |
| WO | WO 96/27136 | 9/1996 | G01R/1/73 |

\* cited by examiner

Primary Examiner—Ernest Karlsen
Assistant Examiner—Minh N. Tang
(74) Attorney, Agent, or Firm—J. Grant Houston, Esq.

(57) ABSTRACT

A circuit board test apparatus comprises a plurality of circuit board test points. The test apparatus is provided with an electronic analyzer comprising a plurality of test connections, each circuit board test point being in contact with a test connection via an electrical connection. The electronic analyzer is electrically connected to a grid pattern, an adapter and/or a translator being mounted on the grid pattern. The adapter and/or translator, on which a circuit board to be tested is to be placed, produces an electrical contact from circuit board test points on the circuit board to contact points of the grid pattern. At least two contact points of the grid pattern are electrically connected to each other.

47 Claims, 9 Drawing Sheets

FIG. 5

PRINTED CIRCUIT BOARD TEST APPARATUS AND METHOD

RELATED APPLICATIONS

This application is a continuation of U.S. application Ser. No. 08/956,583, "Printed Circuit Board Test Apparatus and Method," filed on Oct. 23, 1997 (now abandon) by Manfred Prokopp, the entire teachings of which are incorporated herein by reference.

This application claims priority to German Application No. 197 18 637.8 filed May 2, 1997 by Manfred Prokopp and German Application No. 196 44 725.9 filed Oct. 28, 1996 by Manfred Prokopp.

This application is related to U.S. Ser. No. 08/956,810, filed Oct. 23, 1997, entitled "Apparatus and Method for Testing Non-Componented Printed Circuit Boards", (now U.S. Pat. No. 6,154,863) by Manfred Prokopp, the entire teachings of which are incorporated herein by reference.

BACKGROUND OF THE INVENTION

Printed circuit boards comprise a plurality of circuits, the density of which on the circuit boards is increasing all the time as miniaturization of electronics components continues.

Known circuit board test apparatus or fixtures, respectively, can be basically divided into two classes. Belonging to the first class are the so-called parallel testers, i.e., test apparatus having an adapter in which all circuit board test points are contacted simultaneously by means of the adapter. The second class comprises the so-called finger testers, these being apparatus which sequentially scan the individual circuit board test points by two or more finger probes.

Adapter-type test apparatus are disclosed, for example, in DE 42 37 591 A1, in DE 44 06 538 A1, in DE 43 23 276 A, in EP 215 146 B1, and in DE 38 38 413 A1.

Such adapters basically serve to adapt the irregular configuration of the circuit board test points of the board under test to a given grid pattern of the electrical test apparatus. In the case of modem boards under test, these test points are no longer arranged in a regular grid pattern, this being the reason why the contact nails producing the connection between the contact grid pattern and the circuit board test points are arranged tilted or deflecting in the adapter or a so-called translator is provided which "translates" the regular contact grid pattern into the irregular configuration of the circuit board test points.

Depending on the type of apparatus involved, the individual circuits are tested for open circuits in the circuits ("open-circuit test") and for shorts to other circuits ("short-circuit test"). The short-circuit test may involve detecting both low-impedance and high-impedance shorts.

Various test methods are known for both open-circuit and short-circuit testing, in which each circuit is tested for a short circuit or each branch of a circuit tested for an open circuit. Generally, modem circuit boards having a plurality of circuits require a corresponding large number of individual test procedures to be carried out.

Attempts have been made to optimize the individual test procedures and to minimize the number thereof. A plurality of differing methods have been proposed and put into practice for this purpose.

Known furthermore are apparatus for testing componented circuit boards (e.g., WO96/27136). Testing componented circuit boards is principally different than testing non-componented circuit boards since in the case of componented circuit boards a so-called function test may be implemented. As a rule, each circuit of the circuit board is contacted at one point only and a voltage or current value is sensed which varies as a function of predetermined voltages or currents. This is possible since in the case of componented circuit boards all function elements (ICs, transistors, resistors, capacitors, etc.) are present and their function can be tested. The number of contacts made between the test apparatus and the board under test is thus significantly less when testing componented circuit boards than when testing non-componented circuit boards.

Conventional apparatus for testing componented circuit boards and implementing the function test comprise an adapter, the probes of which require complicated wiring. As compared to such test apparatus, WO 96/27136 provides for an adapter system having a grid base on which several contact pads are electrically connected to each other via test channels. These contact pads are positioned on the grid base in a mixed distribution. The grid center-spacing of the grid base is usually 1.27 mm. The wiring is thus integrated in the grid base. Such an apparatus is unsuitable for testing non-componented circuit boards which need to be contacted with a much higher contact density.

SUMMARY OF THE INVENTION

The invention is based on the object of providing a test apparatus for testing non-componented circuit boards with which circuit boards having a high circuit board test point density and/or a very small circuit board test point center-spacing can be tested.

This object is achieved by a test apparatus, for testing non-componented printed circuit boards, comprising an electronic analyzer electrically connected to a grid pattern, whereon an adapter and/or translator is mounted. The circuit board to be tested is then placed on the adaptor and/or translator. The adapter and/or translator produces an electrical contact from the circuit board test points on the circuit board to contact points of the grid pattern. At least two contact points of the grid pattern are electrically connected to each other. The contact points comprise at least in some portions a center-spacing (a) of 800 $\mu$m or less.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the drawings, reference characters refer to the same parts throughout the different views. The drawings are not necessarily to scale, emphasis instead being placed upon illustrating the principles of the invention.

The invention will now be described in more detail with reference to the drawing in which:

FIG. 5 is a schematic simplified illustration of a further grid pattern as viewed from above.

DESCRIPTION OF THE PREFERRED EMBODIMENTS

The test apparatus comprises an electronic analyzer which is electrically connected to a grid pattern. Mounted on the grid pattern is an adapter. A circuit board to be tested is placed on the adapter, the latter producing an electrical connection between the test points on the board under test and a contact point or a pad field of the grid pattern in each case. A translator board may be inserted in the adapter by means of which the electrical connections can be translated from one contact point to a circuit board test point spaced away from the former.

Figure 1:
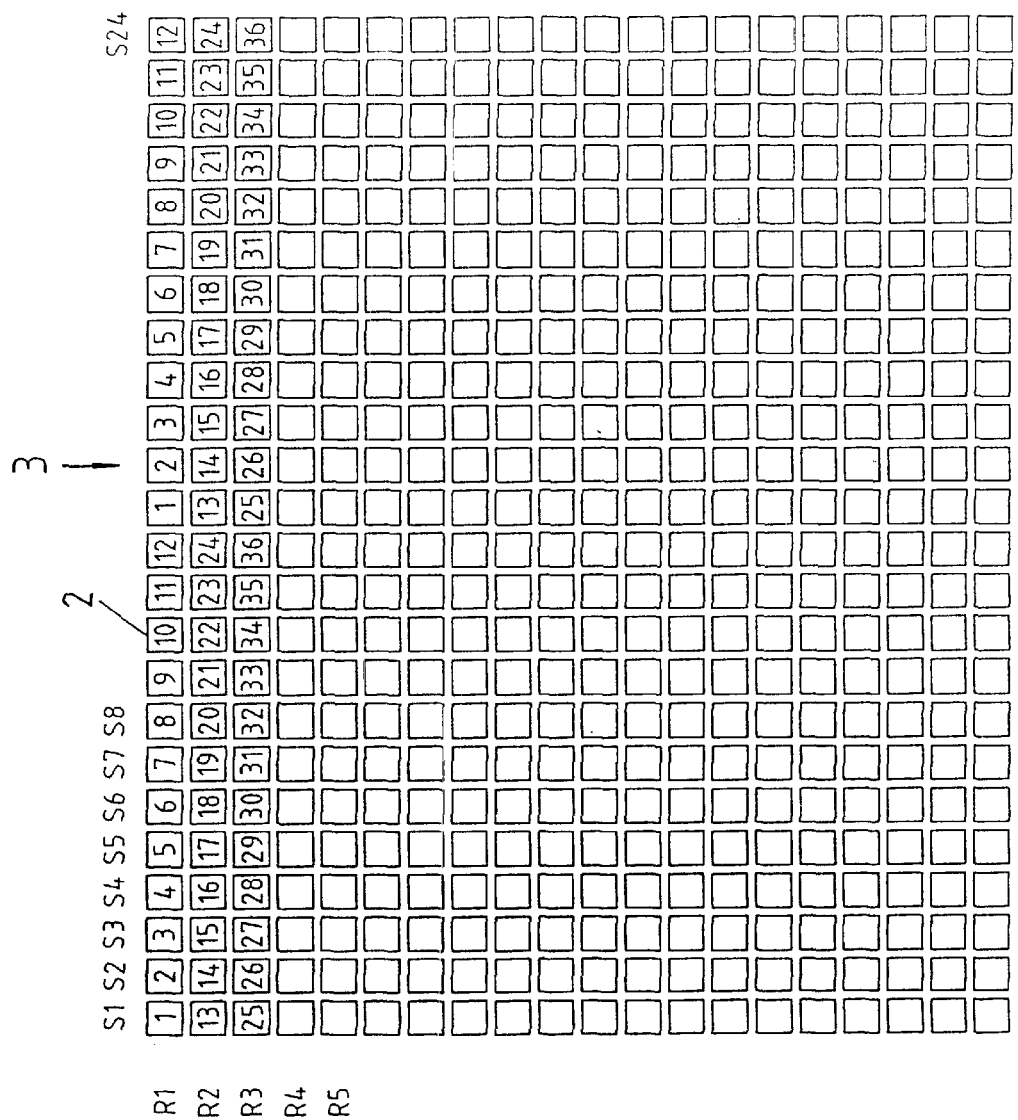
FIG. 1 is a simplified schematic illustration of a grid pattern as viewed from above.

Referring to FIG. 1, the apparatus in accordance with the invention comprises a grid pattern array 1 having several contact points 2 configured on a grid base 3, at least two contact points 2 of the grid pattern array 1 being electrically connected in the grid base 3.

The grid base 3 is preferably configured as a laminated circuit board. The example embodiment as shown in FIG. 2 comprises an upper and lower defining layer 4, 5 and thirteen intermediate layers 6.

Extending from each contact point 2 vertically upwards through the topmost layer 4 and all intermediate layers 6 is a vertical feed-through contact 7. The feed-through contacts 7 are configured as holes having a conductive, metallized plating. The feed-through contacts 7 are arranged, for example, in a regular square grid pattern, the center-spacing a between two feed-through contacts 7 being 500 $\mu$m, for example. In the case of ceramic grid bases 3, the center-spacing a may be reduced down to 100 $\mu$m. Other kinds of regular grid patterns are possible, such as e.g., a rectangular or hexagonal grid pattern or also a grid pattern in which the feed-through contacts 7 of adjacent rows are arranged staggered. The feed-through contacts 7 and the corresponding contact points 2 are thus arranged in rows (R1, R2, ... ) and columns (S1, S2, ... ) (FIG. 1). Between two rows of feed-through contacts 7, conductor paths 10 are embedded in the grid base 3, which are termed scanning channels in the following discussion. In the example embodiment as shown in FIG. 1, twelve scanning channels 10 are provided between two rows of feed-through contacts 7. This results in a total of twenty-four in the case of the example embodiment as shown in FIG. 2, each arranged in pairs with an inter-coating between two intermediate layers 6. The twelve pairs of scanning channels 10 arranged adjacent to a row of feed-through contacts 7 in each case are assigned to this row. Each plated-through contact 7 and thus each contact point 2 of a certain row is connected electrically with one of the scanning channels 10 assigned to this row via a branch line 11.

Figure 2:
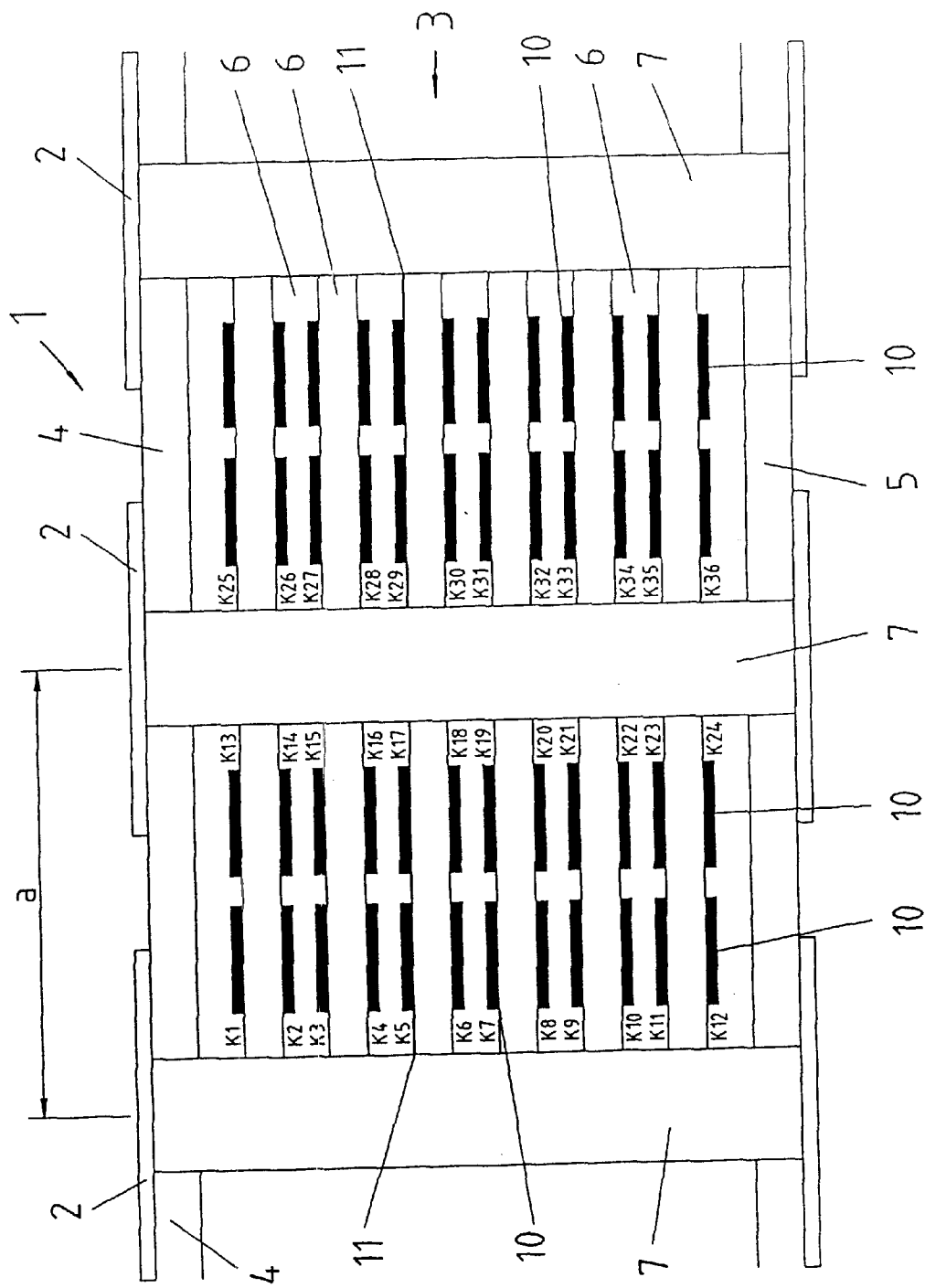
FIG. 2 is a cross-section through a grid base in the portion between two scanning channels.

In FIG. 2, the 36 channels are identified K1 to K36. In FIG. 1, the numbers of the channels refer to the contact points 2 of the first three rows to which they are electrically connected. In accordance with the embodiment as shown in FIG. 1, each 12th contact point 2 in a row is electrically connected to the same scanning channel 10. This means, in other words, that every 12th contact point 2 of a row is electrically connected via a scanning channel 10, thus providing scanning of a number of contact points 2 by a single scanning channel 10 in each case. As a result, the conductor path structure in the grid base 3 is substantially simplified so that the feed-through contacts 7 can be arranged much more tightly spaced than on conventional grid bases and thus the grid pattern density of the contact points 2 can be significantly increased.

The scanning channels 10 are connected at the edges of the grid base 3 to electrical connections such as, e.g., connectors to which the scan or electronic analyzer circuitry can be connected. Despite the many contact points 2 on the grid pattern array 1, the number of test connections of the electronic analyzer is relatively low. Merely one test connection needs to be provided for each scanning channel 10.

In known test apparatus, a separate test connection to the electronic analyzer is provided for each contact point 2. As compared to these known test apparatus, the electronic circuitry of the analyzer in the present invention is considerably reduced, namely by precisely the degree with which the contact points are grouped together at the scanning channels and the test connections are reduced.

Instead of a connector any suitable releasable and non-releasable electrical connection may be provided at the interface between the grid base 3 and the electronic analyzer. For example, the test connections may be soldered to the scanning channels 10. Such a non-releasable electrical connection is especially suitable when the electronic analyzer is integrated in the grid base 3 or secured adjacent to the underside of the grid base 3.

In addition to this, the mechanical configuration of the apparatus in accordance with the invention is very simple since the electrical connections are arranged on the side of the grid base 3. The electronics can be arranged physically separate from the grid base 3. Accordingly, pressure elements, such as, e.g., a pressure plate may be arranged directly underneath the grid base 3 with which the grid base 3 and an adapter and/or a translator are pressed against the board under test.

Due to the electrical connection of the contact points individual circuits of the board under test are electrically connected so that a conventional open circuit or short-circuit test would not possible for so-called parallel testers (=test apparatus and adapter).

It has been surprisingly discovered that this problem is not encountered in the majority of the boards under test. These boards feature nests of circuit board test points in which the circuit board test points are arranged tightly juxtaposed in high density. The remaining circuit board test points are arranged distributed over the circuit board with a greater spacing. It is only in the region of the nests of the circuit board test points that the majority of contact points 2 of the grid pattern 1 is contacted. Most of the remaining contact points are unused. This is why by a clever arrangement of the circuit board on the test apparatus such undesirable electrical connections or short-circuits can be avoided.

Figure 3A:
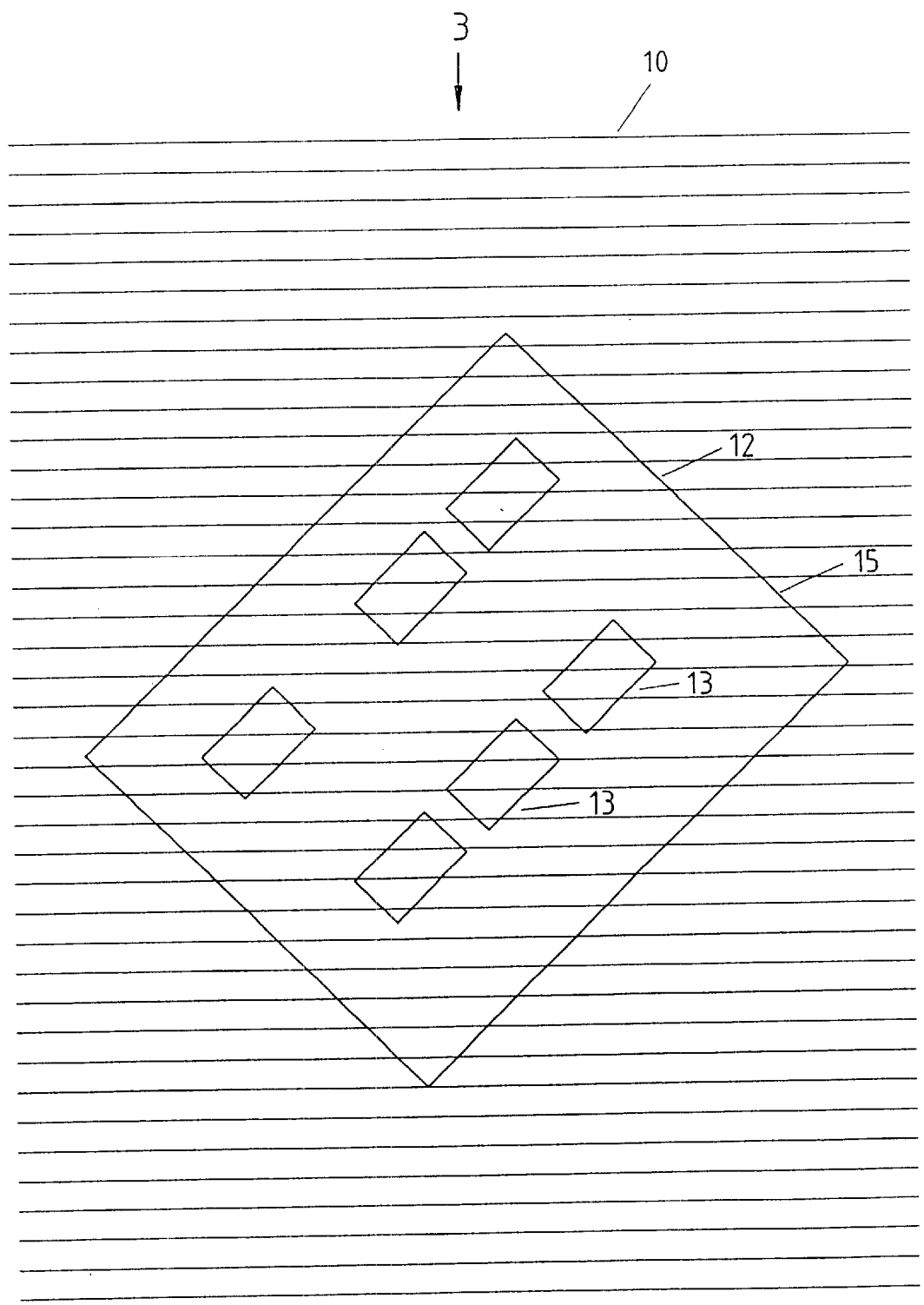
FIG. 3a to 3c are each a highly simplified schematic illustration of an arrangement of a board under test on a grid base.
Figure 3B:
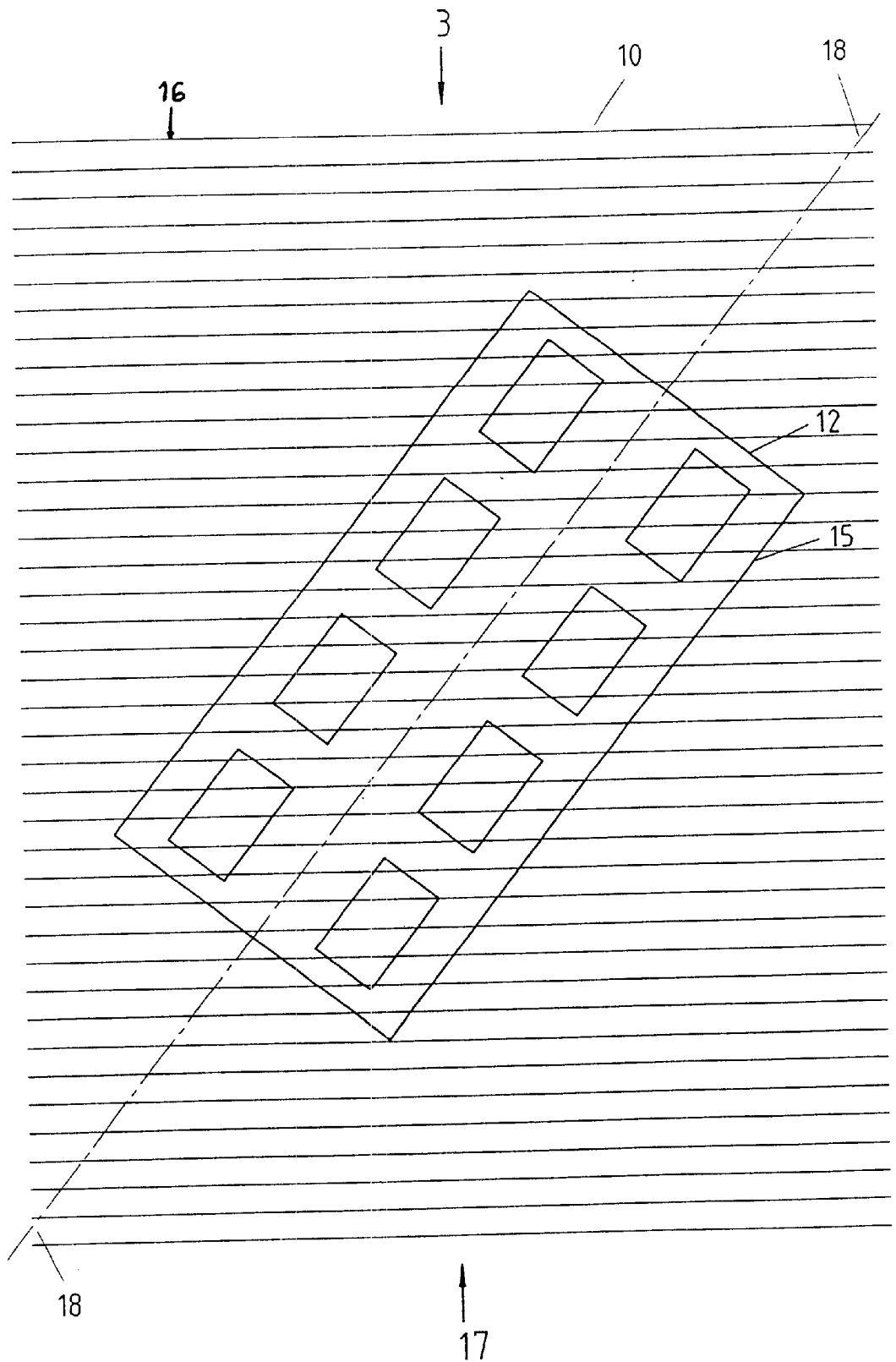
Figure 3C:
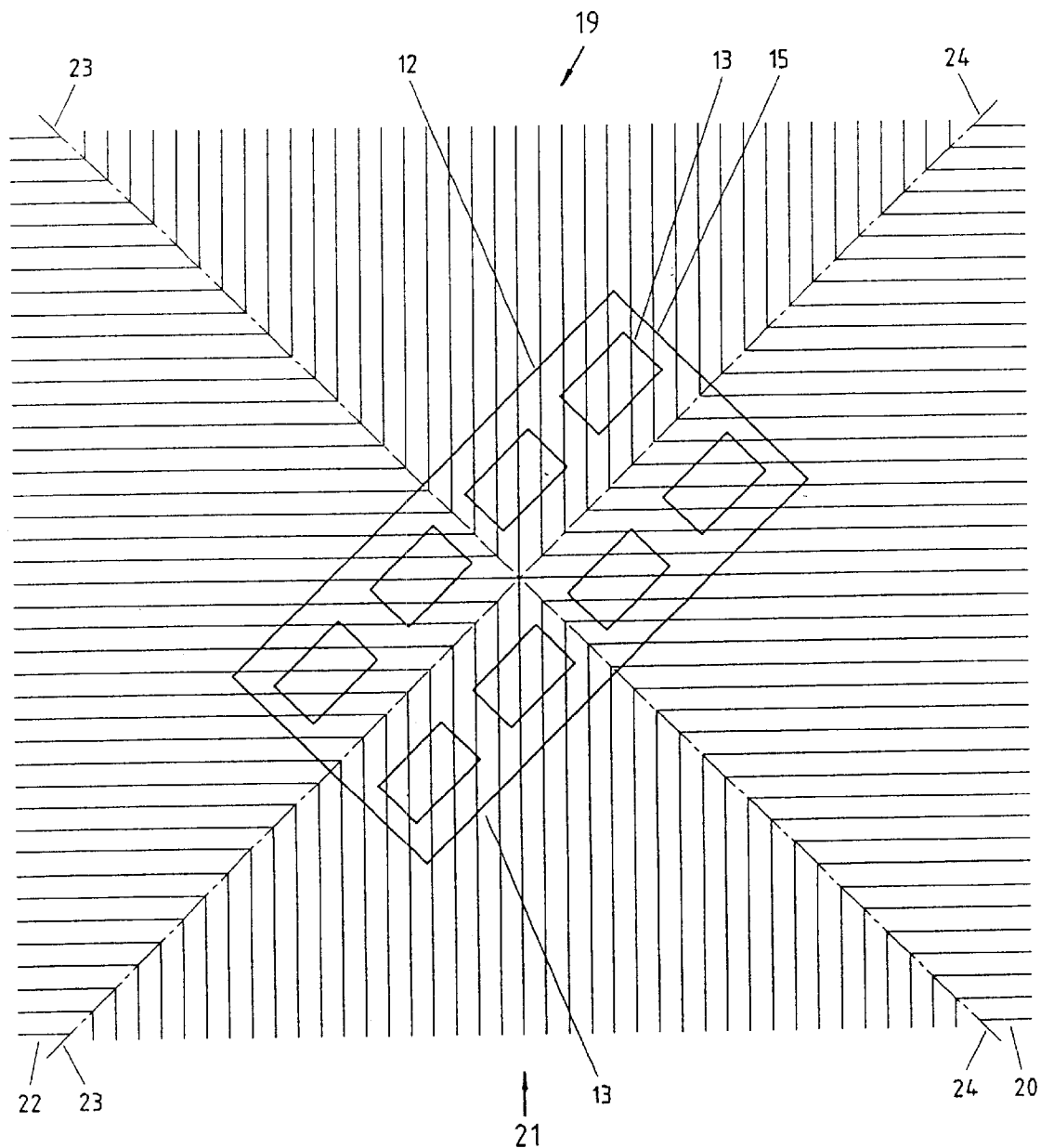

Arrangements of this kind are illustrated schematically simplified in FIGS. 3a to 3c, which depict the contour of the board under test, the nests 13 of circuit board test points thereof, and the orientation of the scanning channels 10. As shown in FIG. 3a the rectangular circuit board 12 is arranged with its side edges 15 skew to the scanning channels 10. The nests 13 of circuit board test points are arranged on the circuit board 12 usually along rows oriented parallel to the side edges 15 so that due to the skew, arrangement of the several nests of circuit board test points over the same scanning channels 10 is avoided. As a result, the probability of a scanning channel being contacted by several circuit board test points of the board under test 12 is significantly reduced.

FIG. 3b illustrates a grid base 3, the scanning channels 10 of which do not extend over the full width or length of the grid base 3. They instead are distributed in two portions 16, 17, separate from each other along a parting line 18 oriented diagonally on the grid base 3. The two portions 16, 17 are totally decoupled from each other electrically, so that no electrical connection intersecting the parting line 18 can occur above the scanning channels 10.

Preferably the grid base 3 is also divided mechanically into two portions 16, 17. The mechanical parting line need not be oriented between the electrically decoupled portions 16, 17. Instead it may also be arranged between any two scanning channels 10.

The grid base 3 may also be electrically and/or mechanically divided into several portions 19, 20, 21, 22 decoupled from each other as shown in FIG. 3c. Parting lines 23, 24 are preferably arranged diagonally on the grid base 3.

The problem of undesirable electrical connections may also be confronted in the construction of the adapter, which is arranged between the grid pattern and the board under test. This is accomplished by arranging the adapter on the grid pattern 1 and selecting the assignment of the contact points of the grid pattern to the circuits of the board under test so that undesired electrical connections do not occur. This is often possible since as a rule many contact points of the grid pattern are not used, only the contact points in the region of the nests of circuit board test points are employed intensively.

As a rule, the adapter system comprises nail-type probes, which produce an electrical contact between the contact points and the circuit board test points of the board under test or an interposed translator. By slightly tilting the probes, the connection from one circuit board test point to a contact point 2 of the grid pattern 1 not arranged directly perpendicularly under the circuit board test point can be produced. Since the contact points on the grid pattern 1 in accordance with the invention are arranged very densely juxtaposed, a portion of, e.g., 16 contact points 2 can be sensed by a single probe. This enables a single contact point 2 to be specifically selected from an array of contact points 2 arranged densely juxtaposed. As a result, a corresponding scanning channel 10 can also be selected. Accordingly, by suitably configuring the adapter, undesired electrical connections or short-circuits can be specifically eliminated.

By the possibilities, as described above, of reducing the probability of an undesirable electrical connection occurring between two circuits, it can be achieved in the ideal situation that each scanning channel is electrically connected to not more than a sole circuit board test point. The grid pattern in accordance with the invention features an unusually high contact point density so that a local selection can be made between several contact points or several scanning channels.

It has been surprisingly discovered that for a 630 μm center-spacing of the contact points 2 and a probe deflection of four contact points in one direction (=16 contact points in the surface area) and a repetition sequence of 32, i.e., every 32nd contact point 2 of a row being electrically connected to the same scanning channel 10, more than 98% of all types of circuit boards having up to 15,000 circuit board test points can be arranged without a scanning channel in the test apparatus being double-occupied. Particularly surprising is the fact that the majority of the circuit boards, more particularly almost all of them having up to approx 10,000 circuit board test points, can be resolved without the scanning channels being double-occupied in an arrangement predetermined relative to the test apparatus, namely that in which they are already tested by conventional test apparatus. In the case of automated test apparatus, the circuit boards are oriented in this arrangement with their longitudinal direction in the direction of transport of the automated test apparatus.

The meaning of this result is that conventional circuit boards can now be tested with substantially fewer electronic analyzers by an apparatus in accordance with the invention. As a result, the costs for such a test apparatus are significantly reduced. On top of this, the test apparatus in accordance with the invention for testing non-componented circuit boards can be put to use for testing future circuit boards comprising a higher density of circuit board test points, especially in the region of nests of circuit board test points.

Figure 4A:
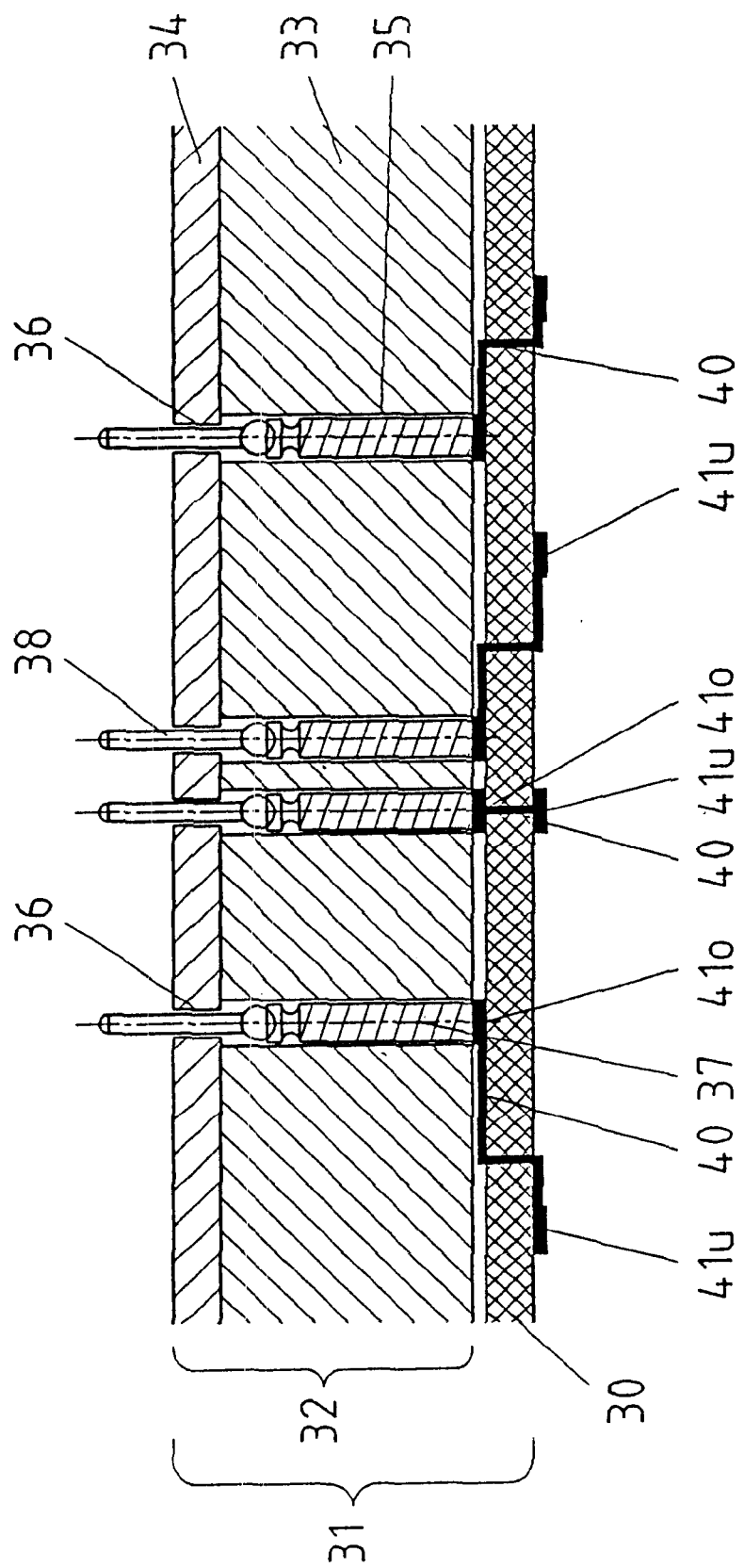
FIG. 4a is a cross-section through a pin translator adapter.

Should tilting the probes fail to eliminate all undesirable electrical connections, a translator or translator board 30 (FIGS. 4a, 4b) can be used also in combination with or as an alternative to an adapter having tilted probes. A translator board 30 can be integrated in a so-called translator adaptor 31 comprising the translator board 30 and a pin translator adaptor 32. The pin translator adaptor 32 is made up of two layers 33, 34 through which vertical holes 35, 36 are drilled, having the same drill pattern in each case, so that the holes 35, 36 are aligned paired. Arranged in each hole in the lower layer is a pin-type contact spring element 37. A pin 38 is arranged at the top end of each contact spring element 37. The pin 38 extends through a hole and protrudes from the pin translator adaptor 32 by its top end portion. The pins 38 are mounted on the contact spring elements 37 to be vertically pliant.

Instead of a pin translator adaptor 32 with the contact spring elements 37 and pins 38, the translator adaptor 31 may also comprise an adapter having tilted straight probes, bending probes or electrically conductive rubber buttons or some other suitable means for producing electrical connections.

The translator board 30 is arranged underneath the pin translator adaptor 32. It is configured as a circuit board having conductor paths 40 extending from its top plane to its bottom plane. Configured at the end points of the conductor paths 40 on the top and bottom plane of the translator board 30 is a contact pad 41o, 41u respectively. The contact pads 41u on the bottom plane of the translator board 30 are connected via a full grid adapter, known as such, to the contact points 2 of the grid pattern array 1.

Figure 4B:
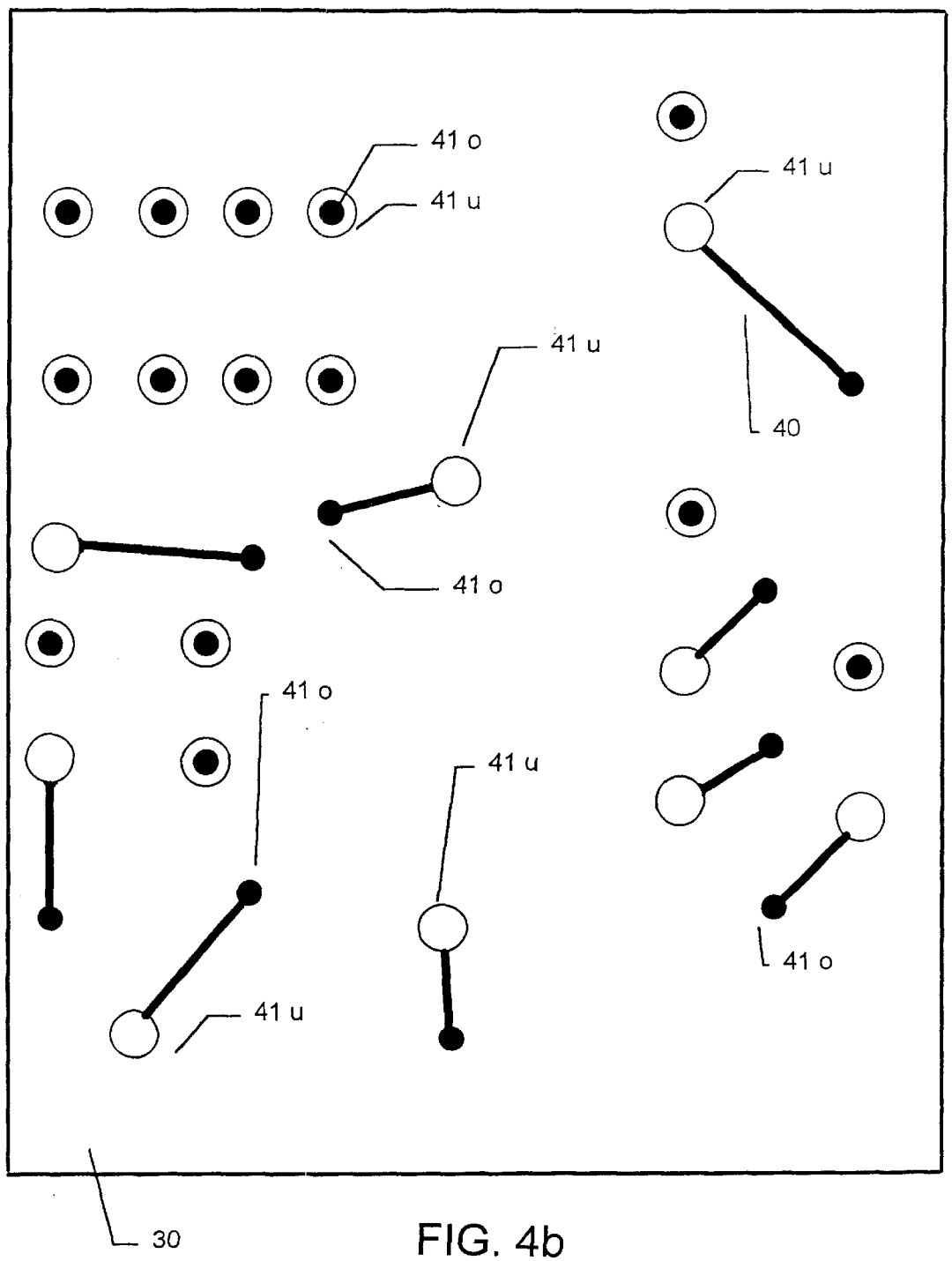
FIG. 4b is a schematic view from above of the conductor paths of a translator.

The translator board in accordance with the invention comprises conductor paths 40 vertical passing through the translator board. In this arrangement, merely the circuit board test points, which were undesirably electrically connected via the scanning channels, are routed in the translator board to another contact point 2 so that the undesirable electrical connections, e.g., double-occupation of a scanning channel, are eliminated. In FIG. 4b, the top conductor paths 41o are represented by a dot and the bottom conductor paths 41u by a ring.

Figure 5:
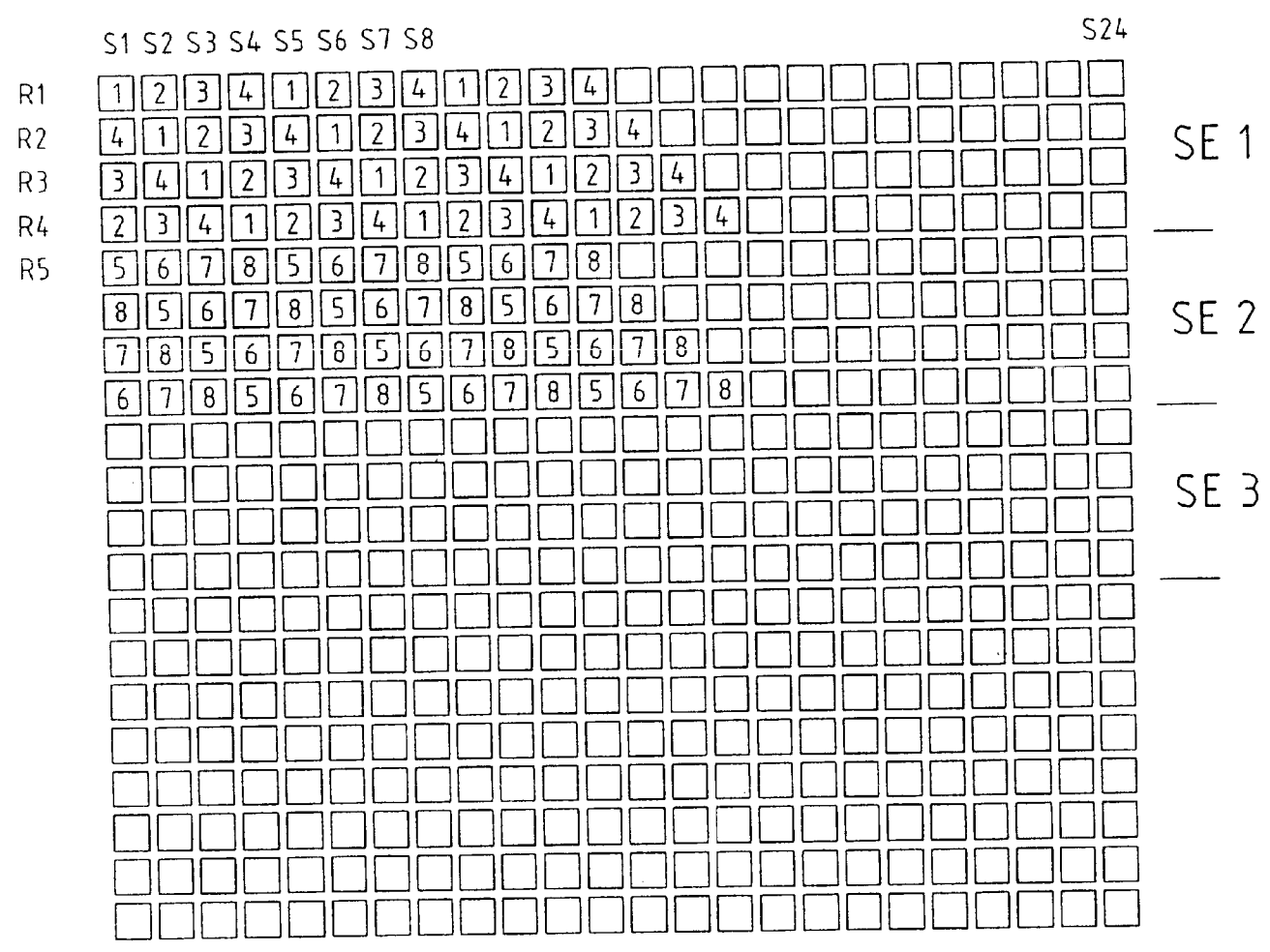

A further example embodiment of a grid pattern array in accordance with the invention is illustrated in FIG. 5. This grid pattern array is divided into 20 horizontal rows (R1–R20) and 24 vertical columns (S1–S24). The number of rows and columns will be far greater in an actual implementation. Four adjacent rows (R1–R4; R5–R8; R9–R12; etc.) each form a segment (SE1, SE2, SE3, etc.). In the segments, each fourth contact point of a row is connected to a scanning channel. In the segments, contact points 2 of the individual rows are connected to the same scanning channel. The contact points of two adjacent rows connected to a scanning channel are preferably arranged diagonally on the grid base. In the example embodiment as shown in FIG. 5, four scanning channels are provided per segment. In the first segment, the contact points 1 are connected to the first of the scanning channels, the contact points 2 to the second scanning channel, the contact points 3 to the third scanning channel, and the contact points 4 to the fourth scanning channel. The scanning channels comprise electrical connections to the contact points 2 of several rows. The contact points 2 of adjacent rows or columns connected to a scanning channel are arranged preferably staggered. Since the scanning channels are connected to contact points of several rows, the number of scanning channels is further reduced.

The scanning channels 10 between the individual layers 6 in the grid base 3 can be arranged in differing directions as viewing the grid base 3 from above, they being, more particularly, arranged vertically to each other, as a result of which a local selectivity can be achieved.

Figure 6:
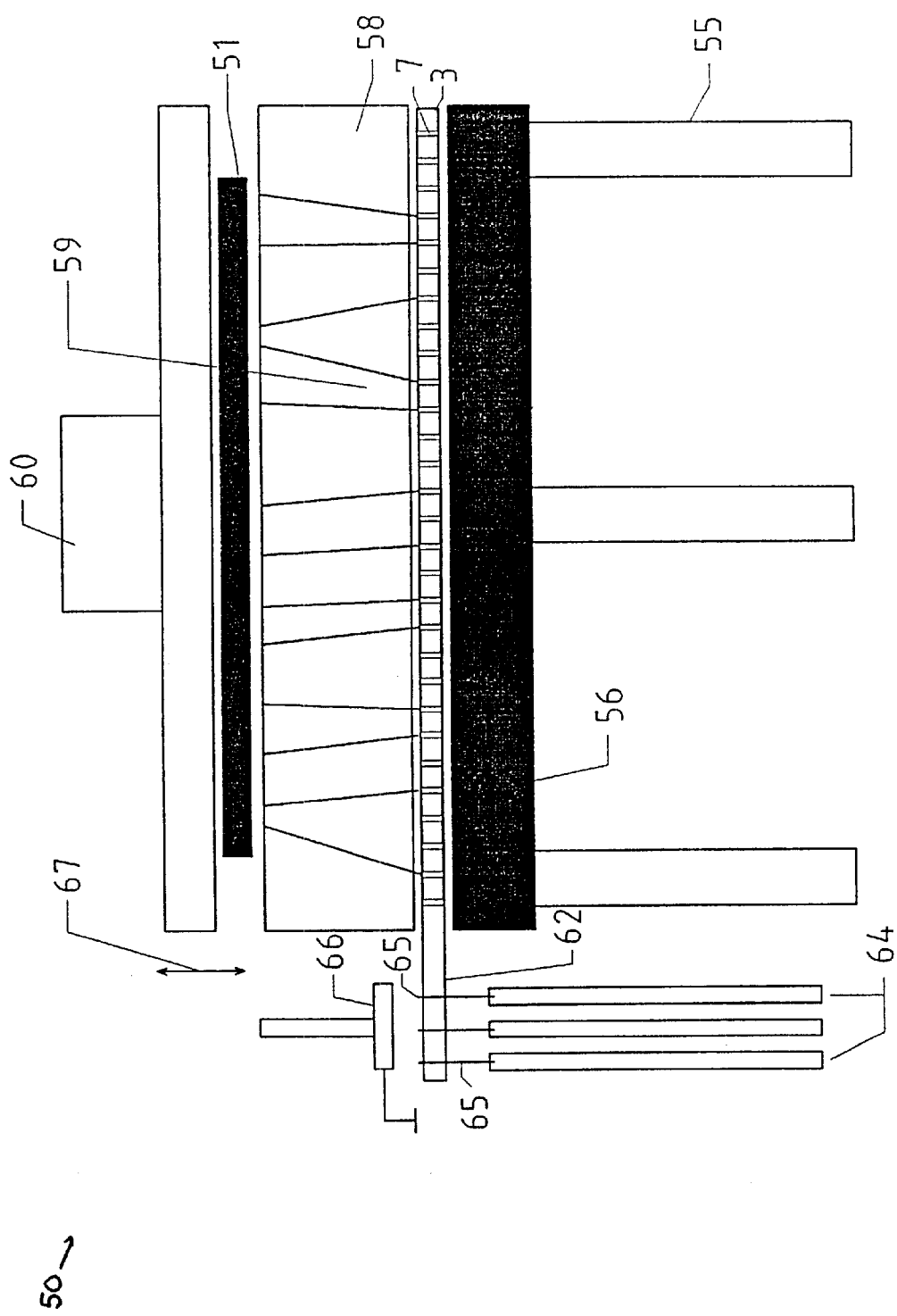
FIG. 6 is a schematic cross-sectional view of a test apparatus in accordance with the invention.

Illustrated schematically simplified in FIG. 6 is a apparatus for testing non-componented circuit boards 51.

This apparatus comprises a solid table 55 having a table top 56. The table top 56 is insulated and mounts a grid base 3 in accordance with the invention. Arranged on the grid base 3 is an adapter 58 having probes 59, more particularly, rigid probes. The probes 59 can be tilted to select a specific scanning channel as described above. Mounted on the adapter 58 is the board under test 51 which is pressed against the adapter by a plunger 60.

The grid base 3 comprises a connection portion 62 protruding beyond the table top 56 into which the scanning channels (not shown) extend. Arranged on the underside of this connection portion 62 are units 64 of the electronic analyzer connected electrically to the scanning channels by contact pins 65 or the like. These contact pins 65 extend vertical through the grid base 3 and protrude from the surface thereof. Arranged above the connection portion 62 is an electrically conducting plate parallel to the grid base 3 and mounted vertically shiftable in the direction of the double arrow 67. This plate 66 is grounded.

Together with the electrically grounded plate 66, this connection portion 62 forms a grounding device enabling, before and after testing, the electrical potentials in the circuit board 51 and/or the test apparatus (grid base, adapter, electronic analyzer, etc.) to be discharged by contacting the plate 66 to the contact pins 65 protruding upwards. As a result, defined and known electrical conditions can be created very quickly and the delays between individual test points, needed to discharge the electrical potentials in conventional test apparatus, are significantly reduced. Instead of the aforementioned upwards protruding contact pins 65, exposed contact points may be provided at some other location on the grid base 3, which are electrically connected to the scanning channels and thus to the electronic analyzer and the board under test. By bringing the contact points into contact with a grounded conductor, the board under test and the electronic analyzer are grounded.

In this test apparatus 50, the considerable testing pressure exerted by the plunger 60 is handled by the solid table 55. Conventional test apparatus comprise as a rule units of the electronic analyzer beneath the grid base so that a rather complicated design is needed to handle the testing pressure via the electronics units or in by-passing the latter.

Instead of the table 55, of course, a base or the like may be provided, i.e. merely a rugged mount for the grid base 3.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A test apparatus for testing non-componented printed circuit boards, comprising an electronic analyzer electrically connected to a grid pattern, whereon an adapter or translator is mounted, for receiving a circuit board to be tested, said adapter or translator producing an electrical contact from circuit board test points on said circuit board to be tested to contact points of said grid pattern, wherein a first contact point and a second contact point of said contact points of said grid pattern are electrically connected to each other and to a common scanning channel of a test connection to the electronic analyzer, said first contact point and said second contact point being connected to said circuit board to be tested by said adapter or translator which provides electrical connections between the first and second contact points and the circuit board to be tested, and said contact points comprise, at least in some portions, a center-spacing of 800 $\mu$m or less.

2. The test apparatus as set forth in claim 1, wherein said grid pattern is configured on the surface of a grid base, at least two contact points of said grid pattern being electrically connected to each other in said grid base.

3. The test apparatus as set forth in claim 2, wherein said grid base is configured as a laminated circuit board.

4. The test apparatus as set forth in claim 3, wherein said contact points are arranged in a regular grid pattern.

5. The test apparatus as set forth in claim 4, further comprising feed-through contacts, wherein the feed-through contacts extend from said contact points vertically downwards through individual layers of said grid base.

6. The test apparatus as set forth in claim 5, wherein said contact points have a center-spacing of 50 $\mu$m to 630 $\mu$m.

7. The test apparatus as set forth in claim 1, wherein said adapter comprises probes, each of which ends in a contact point, at least one probe being arranged tilted relative to a line standing perpendicular to said grid pattern.

8. A test apparatus for testing non-componented printed circuit boards, comprising an electronic analyzer electrically connected to a grid pattern, whereon an adapter or translator is mounted, for receiving a circuit board to be tested, said adapter or translator producing an electrical contact from circuit board test points on said circuit board to be tested to contact points of said grid pattern, wherein said contact points of said grid pattern are electrically connected to each other and to a common scanning channel of a test connection to the electronic analyzer, and said contact points comprise, at least in some portions, a center-spacing of 800 $\mu$m or less, wherein feed-through contacts extend from said contact points through said grid base, wherein said feed-through contacts and said contact points are arranged in several rows and scanning channels are oriented between the rows of feed-through contacts, each of said feed-through contacts being electrically connected to a single scanning channel.

9. The test apparatus as set forth in claim 8, wherein each $x^{th}$ contact point of a row of contact points is electrically connected to the same scanning channel, where x is a whole number between 3 and 100.

10. The test apparatus as set forth in claim 9, wherein said adapter comprises probes, each of which ends in a contact point, at least one probe being arranged tilted relative to a line standing perpendicular to said grid pattern.

11. The test apparatus as set forth in claim 10, wherein groups of at least three or more contact points are electrically connected to each other.

12. The test apparatus as set forth in claim 11, wherein said translator comprises conductor paths electrically connecting said circuit board test points to said contact points, said conductor paths being configured so that no scanning channel is connected to more than one of said circuit board test points.

13. The test apparatus as set forth in claim 9, wherein an electrical interface is arranged on said grid base for contacting said electronic analyzer.

14. The test apparatus as set forth in claim 13, wherein said electrical interface is configured as a connector.

15. The test apparatus as set forth in claim 14, wherein said grid base is divided mechanically into at least two partial boards.

16. The test apparatus as set forth in claim 15, wherein said grid pattern is divided into at least two portions separate from each other, no contact point of one portion being electrically connected to a contact point of the other portion.

17. The test apparatus as set forth in claim 1, wherein said grid base is divided mechanically into at least two partial boards.

18. The test apparatus as set forth in claim 17, wherein said grid pattern is rectangular in shape, as viewed from above, and is divided into two portions by a diagonally oriented parting line.

19. The test apparatus as set forth in claim 1, wherein said grid pattern is divided into at least two portions separate from each other, no contact point of one portion being electrically connected to a contact point of the other portion.

20. The test apparatus as set forth in claim 19, wherein said grid pattern is divided into at least four portions separate from each other, no contact point of any one portion of said four being electrically connected to a contact point of one of said other three portions.

21. The test apparatus as set forth in claim 1, wherein said adapter comprises probes, each of which ends in a contact point, at least one probe being arranged tilted relative to a line standing perpendicular to said grid pattern.

22. The test apparatus as set forth in claim 1, wherein groups of at least three or more contact points are electrically connected to each other.

23. The test apparatus as set forth in claim 1, wherein said translator comprises conductor paths electrically connecting said circuit board test points to said contact points, said conductor paths being configured so that said circuit board test points are not electrically connected to each other via the grid pattern.

24. The test apparatus as set forth in claim 22, wherein said translator is a translator board comprising, on a first surface, contact pads, each assigned to a circuit board test point, and comprising, on a second surface, contact pads, each assigned to a test connection.

25. The test apparatus as set forth in claim 1, wherein said grid base comprises a connection portion extending beyond a portion of said contact points resting on a mount, units of said electronic analyzer being connected to said portion.

26. The test apparatus as set forth in claim 1, wherein said electronic analyzer and said grid pattern have scanning channels, and wherein said circuit board to be tested is arranged on said test apparatus so that one circuit board test point at the most is electrically connected to each one of the scanning channels.

27. A test apparatus for testing non-componented circuit boards, comprising an electronic analyzer electrically connected to a grid pattern, whereon an adapter or translator is mounted for receiving a circuit board to be tested, said adapter or translator producing electrical contact from circuit board test points on said circuit board to be tested to contact points of said grid pattern, wherein said grid pattern comprises exposed contact points outside of a test portion of said grid pattern assigned to the circuit board to be tested so that by bringing these contact points into contact with a grounded electrical conductor said electronic analyzer or said circuit board to be tested is grounded.

28. The test apparatus as set forth in claim 27, wherein a grid base carrying said grid pattern comprises a connection portion extending beyond a portion of said contact points resting on a mount, units of said electronic analyzer being connected to said connection portion, connecting contacts being exposed at the side of said grid base opposite said corresponding units of said electronic analyzer to facilitate grounding said circuit board to be tested or said electronic analyzer.

29. The test apparatus as set forth in claim 26, wherein said units of said electronic analyzer are arranged on one side of said grid base only.

30. The test apparatus as set forth in claim 4, wherein feed-through contacts extend from said contact points traversely through individual layers of said grid base.

31. The test apparatus as set forth in claim 5, wherein said contact points have a center-spacing of 50 µm to 630 µm.

32. The test apparatus as set forth in claim 5, wherein said contact points have a center-spacing of 300 µm to 500 µm.

33. The test apparatus as set forth in claim 27, further comprising a grounded plate for discharging electrical potentials in the test apparatus by moving the grounded plate toward the exposed contact points outside of the test portion.

34. A test apparatus for testing printed circuit boards, the apparatus comprising:

an electronic analyzer;

a grid pattern electrically connected to the electronic analyzer, the grid pattern comprising contact points, wherein at least a first contact point and a second contact point of said contact points of said grid pattern are electrically connected to each other and to a common scanning channel of a test connection to the electronic analyzer, and a center spacing between at least some of said contact points is less than 800 µm; and an adapter or translator, which is mounted on the grid pattern to receive a circuit board to be tested, said adapter or translator producing an electrical contact between test points of the circuit board to be tested and said first contact point and said second contact point of said contact points of said grid pattern.

35. The test apparatus as set forth in claim 34, wherein said grid pattern is configured on the surface of a grid base, at least two contact points of said grid pattern being electrically connected to each other in said grid base.

36. The test apparatus as set forth in claim 35, wherein said grid base is configured as a laminated circuit board.

37. The test apparatus as set forth in claim 36, wherein said contact points are arranged in a regular grid pattern.

38. The test apparatus as set forth in claim 37, wherein the grid pattern comprises feed-through contacts that extend transversely from said contact points through individual layers of said grid base.

39. The test apparatus as set forth in claim 5, wherein said contact points have a center-spacing of 300 µm to 500 µm.

40. The test apparatus as set forth in claim 8, wherein each $x^{th}$ contact point of a row of contact points is electrically connected to the same scanning channel, where x is a whole number between 20 and 60.

41. A test apparatus for testing printed circuit boards, the apparatus comprising:

an electronic analyzer;

a grid pattern electrically connected to the electronic analyzer, the grid pattern comprising contact points, wherein a first contact point and a second contact point of said contact points of said grid pattern are electrically connected to each other and to a common scanning channel of a test connection to the electronic analyzer, and a center spacing between at least some of said contact points is less than 800 µm; and a connector, which is mounted on the grid pattern to receive a circuit board to be tested, said connector producing an electrical contact between test points of the circuit board to be tested and contact points of said grid pattern, wherein said first contact point and said second contact point are connected to said circuit board to be tested by said connector which provides electrical connections between the first and second contact points and the circuit board to be tested.

42. The test apparatus as set forth in claim 41, wherein said grid pattern is configured on the surface of a grid base, at least two contact points of said grid pattern being electrically connected to each other in said grid base.

43. The test apparatus as set forth in claim 42, wherein said grid base is configured as a laminated circuit board.

44. The test apparatus as set forth in claim 43, wherein said contact points are arranged in a regular grid pattern.

45. The test apparatus as set forth in claim 44, wherein the grid pattern comprises feed-through contacts that extend from said contact points vertically downwards through individual layers of said grid base.

46. The test apparatus as set forth in claim 41, wherein said connector comprises probes, each of which ends in a contact point, at least one probe being arranged tilted relative to a line standing perpendicular to said grid pattern.

47. The test apparatus as set forth in claim 41, wherein multiple groups of at least three or more contact points are electrically connected to each other.

* * * * *